(12) United States Patent
Doley et al.

(10) Patent No.: US 6,550,158 B2
(45) Date of Patent: Apr. 22, 2003

(54) SUBSTRATE HANDLING CHAMBER

(75) Inventors: Allan Doley, Phoenix, AZ (US); Dennis Goodwin, Chandler, AZ (US); Kenneth O'Neill, Phoenix, AZ (US); Gerben Vrijburg, Mesa, AZ (US); David Rodriguez, Phoenix, AZ (US); Ravinder Aggarwal, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 291 days.

(21) Appl. No.: 09/727,736

(22) Filed: Dec. 1, 2000

(65) Prior Publication Data

US 2001/0000759 A1 May 3, 2001

Related U.S. Application Data

(62) Division of application No. 09/113,934, filed on Jul. 10, 1998, now Pat. No. 6,161,311.

(51) Int. Cl.$^7$ ................................................. F26B 3/00
(52) U.S. Cl. .......................... 34/451; 34/404; 34/406; 34/409; 34/467; 34/487; 414/939
(58) Field of Search .......................... 34/402, 403, 404, 34/406, 409, 445, 448, 451, 467, 487, 480; 414/217, 939; 118/715, 719

(56) References Cited

U.S. PATENT DOCUMENTS

| 4,503,807 A | 3/1985 | Nakayama et al. ......... 118/719 |
| 4,747,367 A | 5/1988 | Posa ......................... 118/715 |
| 4,793,283 A | 12/1988 | Sarkozy ..................... 118/725 |
| 4,828,224 A | * 5/1989 | Crabbe et al. .............. 251/298 |
| 4,976,610 A | 12/1990 | Yates ......................... 432/11 |
| 5,020,475 A | 6/1991 | Crabb et al. ................ 118/719 |
| 5,080,549 A | 1/1992 | Goodwin et al. ........ 414/744.8 |
| 5,092,728 A | 3/1992 | Crabb et al. ................ 414/217 |
| 5,094,885 A | 3/1992 | Selbrede ................... 427/248.1 |
| 5,200,232 A | 4/1993 | Tappan et al. .............. 427/569 |
| 5,207,835 A | 5/1993 | Moore ........................ 118/725 |
| 5,232,506 A | * 8/1993 | Kawase ...................... 118/719 |
| 5,365,772 A | 11/1994 | Ueda et al. .................. 73/40.7 |
| 5,366,557 A | 11/1994 | Yu ............................. 118/725 |
| 5,373,806 A | 12/1994 | Logar ......................... 117/106 |
| 5,411,593 A | 5/1995 | Carlson et al. ............. 118/719 |
| 5,492,566 A | 2/1996 | Sumnitsch .................. 118/500 |
| 5,505,779 A | 4/1996 | Mizuno et al. ............. 118/719 |

(List continued on next page.)

Primary Examiner—Ira S. Lazarus
Assistant Examiner—Kathryns O. Malley
(74) Attorney, Agent, or Firm—Knobbe, Martens, Olson & Bear, LLP (57) ABSTRACT

An apparatus and method for reducing particles in reactors. The apparatus includes an enclosure with a wafer handling chamber connected by an isolation gate valve to a processing chamber. Pipes deliver purge gas into the wafer handling chamber to eliminate particles from the enclosure. A pilot operated back pressure regulator regulates the delivery and removal of the purge gas. The apparatus actuates the isolation gate valve in a controlled rate to reduce disturbances from the purge gas entering into the enclosure. A Bernoulli wand is provided for lifting and holding a single semiconductor wafer. A dome loaded regulator actuated by a pilot gas is used to control the ramp rates of gas to the Bernoulli wand. The ramping rates of the Bernoulli wand gas can be controlled by restrictions and check valves in the pilot gas line. The apparatus also utilizes ionizers in the purge gas lines entering the wafer handling chamber and load locks. Through the use of an alpha particle emission source in the purge gas line prior to the load lock and wafer handling chamber, the purged gas molecules are ionized. The ionized gas is conductive and therefore discharges static so that wafers are no longer attracted to each other by electrostatic force. In addition, the apparatus includes means for reducing gas flow turbulence when switching valves within the reactor.

10 Claims, 5 Drawing Sheets

U.S. PATENT DOCUMENTS

| | | | |
|---|---|---|---|
| 5,614,247 A | 3/1997 | Barbee et al. | 427/8 |
| 5,624,499 A | 4/1997 | Mizuno et al. | 118/725 |
| 5,833,425 A * | 11/1998 | Jeon et al. | 414/217 |
| 5,871,813 A * | 2/1999 | Pham | 427/248.1 |
| 5,997,588 A | 12/1999 | Goodwin et al. | 29/25.01 |
| 6,025,602 A | 2/2000 | Rose et al. | 250/492.21 |
| 6,067,728 A | 5/2000 | Farmer et al. | 34/470 |
| 6,082,150 A | 7/2000 | Stucker | 68/18 R |
| 6,086,678 A | 7/2000 | Wilson et al. | 118/715 |

\* cited by examiner

SUBSTRATE HANDLING CHAMBER

This application is a divisional of U.S. application Ser. No. 09/113,934 filed Jul. 10, 1998, now U.S. Pat. No. 6,161,311.

BACKGROUND OF THE INVENTION

TECHNICAL FIELD OF THE INVENTION

The invention relates to the process of forming films of material on semiconductor wafers through the use of carrier gases within a reactor chamber. In particular, the present invention relates to the epitaxial deposition of specific materials onto a silicon wafer and to a system and method for reducing or eliminating particulate matter and the resulting particle-related defects on the finished wafer.

In most semiconductor manufacturing equipment used for growth of films of material onto semiconductor wafers, the wafers are loaded in one or multiple load locks and transported through a wafer handling chamber to a reactor, where the actual material is deposited onto the semiconductor wafers by means of gases or vapors. The gas in the load lock, wafer handling chamber and reactor must be as particle-free as possible in order to reduce the number of defects on the semiconductor wafer surface.

Improvements in the capabilities of semiconductor manufacturing equipment continues at an astonishing rate. As capabilities of lithography and etching equipment increases the circuit density on a wafer increases and with the increase in circuit density the specification for particle free environment within the processing equipment also increases. In addition to the resulting circuit density that has been achieved with the improvements in lithography and etching, the size of wafers has increased to 300 mm. Semiconductor manufacturers require further production improvements through the increase in the yields of semiconductor devices from the equipment use to manufacture those devices. The implementation of epitaxial layers, both homoepitaxial and heteroepitaxial, on an underlying substrate layer has a great impact on the yields of the associated semiconductor wafers. A primary example is the growth of epitaxial silicon on a semiconductor wafer substrate. Growth of an epitaxial silicon layer is typically performed in a chemical vapor deposition process in which the wafers are heated while a gaseous silicon compound is passed over the wafer to affect pyrolysis or decomposition. Epitaxial depositions in general and silicon epitaxial deposition in particular are integral parts of VLSI processing, especially for the advanced bipolar, NMOS and CMOS technologies, since many of the components of the individual transistors and devices are formed in an epitaxial layer.

The ability to process good quality advanced NMOS, CMOS and bipolar IC chips using epitaxy is strongly dependent on maintaining a substantially defect-free state (1) for the bulk semiconductor wafer and for the surface of the bulk wafer, and (2) during the step of depositing the epitaxial silicon layer. Simply put, and as discussed below, elimination of both sub-surface and surface defects is crucial to obtaining good yields in current and future technologies, particularly as those technologies process toward a sub-micron minimum device feature size.

Surface defects are usually related to undesirable particles. It is extremely critical for sub-micron minimum device feature sizes and for large chip areas that the undesirable particles be eliminated, since a single defect in such devices can cause nonfunctionality of the device and as few as one defect per square centimeter (about 80 defects per four inch wafer) can have catastrophic effects on wafer processing yields. It is a characteristic of epitaxial processing that the crystallographic nature and defect level of the deposited epitaxial layer or epi layer reflects the parent or bulk substrate wafer. Thus, for example, stacking faults on the substrate can give rise to epitaxial stacking faults, and dislocations in the substrate can be transmitted through the epi layer. In addition, epitaxial defects such as pits and micro-contamination result from the bulk substrate wafer surface particles. As a consequence, even where the parent substrate is substantially defect-free (the introduction of substantially defect-free silicon wafer starting material in the mid 1970's offered this possibility), the growth of defect-free epitaxial layers requires the elimination of particles on the surface of the parent substrate wafer. Unfortunately, using present day epitaxial processing technology, the elimination or substantial decrease in unwanted particles and the associated achievement of very low particle-related defect densities are accomplished by extensive runs and wafer inspection resulting in very low wafer yields.

Although the semiconductor manufacturing equipment is constructed so that particles cannot enter through the walls or with the gas flow, particles may enter the semiconductor manufacturing equipment by other means, such as when semiconductor wafers are put into a load lock, during equipment maintenance or through some other indirect source. Particles generated during the process are removed by the laminar flow of the purge gas. The particles may be transported to the inner surfaces of the equipment and adhere thereon. If particles are present in the gas, or suddenly released from the inner surfaces of the equipment, the particles may be transported to the surface of the semiconductor wafer and cause defects. Undesirable particles including the particles that are to be deposited on the semiconductor wafer during the manufacturing process can be attracted to, deposited and retained on the inner surfaces of the semiconductor manufacturing equipment. Once attracted to the inner surfaces of the semiconductor manufacturing equipment, several different forces including molecular forces (Van der Waals force), capillary forces, and electrostatic forces retain the undesirable particles on the inner surfaces of the semiconductor manufacturing equipment. If for some reason these particles were to be released then they can become airborne and settle on the surfaces of the semiconductor wafers and create defects in the resulting processed wafer. Air turbulence is one way in which these undesirable particles may be freed from their attachment to the inner surfaces of the semiconductor manufacturing equipment.

Once airborne the movement of particles inside the semiconductor manufacturing equipment is subject to several different forces; gravity, the fluid drag of surrounding gas flow, and electrostatic force. Gravity is a very weak force on small particles. Normally, a purge with a particle-free gas is maintained through the semiconductor manufacturing equipment in order to create a particle-free environment. Any particles that are released from the inner surfaces of the equipment are transported by the fluid drag of the purge gas to the gas exhaust. However, electrostatic force negatively affects the removal of particles by the purge gas flow. Particles may be transported to semiconductor wafers by the electrostatic force and remain there during the processing of the semiconductor wafer which will result in defects on the surface of the wafers.

Retention of particles by electrostatic force is erratic since a sudden electrostatic discharge may remove the electrostatic force. The particles released from the inner walls of the equipment may be transported to the surface of a semiconductor wafer and cause defects. Thus it is desirable to eliminate the electrostatic force between particles and the inner walls of the semiconductor manufacturing equipment, so the gas purge flow can remove the retained particles from the inner surfaces of the equipment.

It takes a large amount of energy to release the particles that are retained on the inner surfaces by molecular force. Therefore particles that are retained by the molecular force on the inner surfaces of the equipment are very likely to stay there indefinitely and not cause any defects on semiconductor wafers.

Capillary force is reduced by the reduction of moisture in the equipment. The moisture is reduced by use of construction materials with low moisture permeability and the use of a particle and moisture free gas flow through the equipment. A dry particle-free gas purge such as dry nitrogen evaporates moisture and purges particles that are only being retained by the capillary force on the inner surfaces of the equipment.

U.S. Pat. No. 5,373,806 to Logar (Logar) is an example of an attempt to solve the problem of retained particles. In Logar, electrostatic charges are reduced by heating the substrate to a specific temperature lower than the processing temperature prior to production deposition by the use of a radiant source of energy. This is an extra step that must be taken in the manufacturing process, increasing production time and cost.

Typically particles are removed from the inner surface of the wafer handling chamber and the load locks by purging the wafer handling chamber with a particle-free gas. The semiconductor wafers are transported through the wafer handling chamber and load locks. A laminar flow of gas is provided so that particles can be picked up and carried with the purge gas through an exhaust outlet located within the wafer handling chamber and load locks. However, when a sudden pressure or flow change occurs, the gas flow becomes turbulent, causing particles to be stirred up and transported to the surface of any semiconductor wafer that happen to be in the wafer handling chamber.

Existing systems used to regulate the pressure inside the semiconductor manufacturing equipment often employ the use of a single stage back pressure regulator that is located between a processing chamber and an exhaust outlet. However, the single stage back pressure regulator has difficulty regulating pressure for a large flow of gas.

Another problem with the existing system occurs when a gate valve that isolates the wafer handling chamber from the load lock or processing chamber is opened. If there is a pressure difference between the two chamber, the gas flow in one chamber is diverted to the second chamber, which results in turbulence within the both chambers. Because the single stage back pressure regulators do not completely open, particles, vapors and gases back stream from the exhaust outlet into both chambers.

Thus, it would be a distinct advantage to have an apparatus and method for reducing particles in a epitaxial reactor during the processing of semiconductor wafers. It is an object of the present invention to provide such an apparatus and method.

SUMMARY OF THE INVENTION

A method and apparatus for reducing particles in an epitaxial reactor used in processing of semiconductor wafers and includes an enclosure for processing the semiconductor wafers. A purge gas delivery system removes undesirable particles from the enclosure. Included in the system is a pilot operated back pressure regulator for regulating the exhaust of the purge gas from the enclosure.

The system also includes an ionizing source for conditioning the purge gas that is integrally connected to the purge gas delivery system.

The pilot operated back pressure regulator includes a dome regulator for adjusting purge gas flow, a valve for actuating the dome regulator, and a pressure regulator for delivering the pilot gas to the dome regulator.

The enclosure has a wafer handling chamber and a processing chamber. A robotic arm located within the wafer handling chamber has a Bernoulli wand end affecter that lifts and transporting the semiconductor wafers between the wafer handling chamber and processing chamber. There is included a damper mechanism for dampening the pressure rise when the Bernoulli wand releases a wafer either into a wafer cassette or on to a wafer scepter located within the processing chamber.

The wafer handling chamber is connected by an isolating gate valve to the processing chamber. The isolating gate valve is opened and closed according to a procedure that reduces the disturbances when there is a pressure difference between the wafer handling chamber and the processing chamber.

DETAILED DESCRIPTION OF EMBODIMENTS

Figure 1:
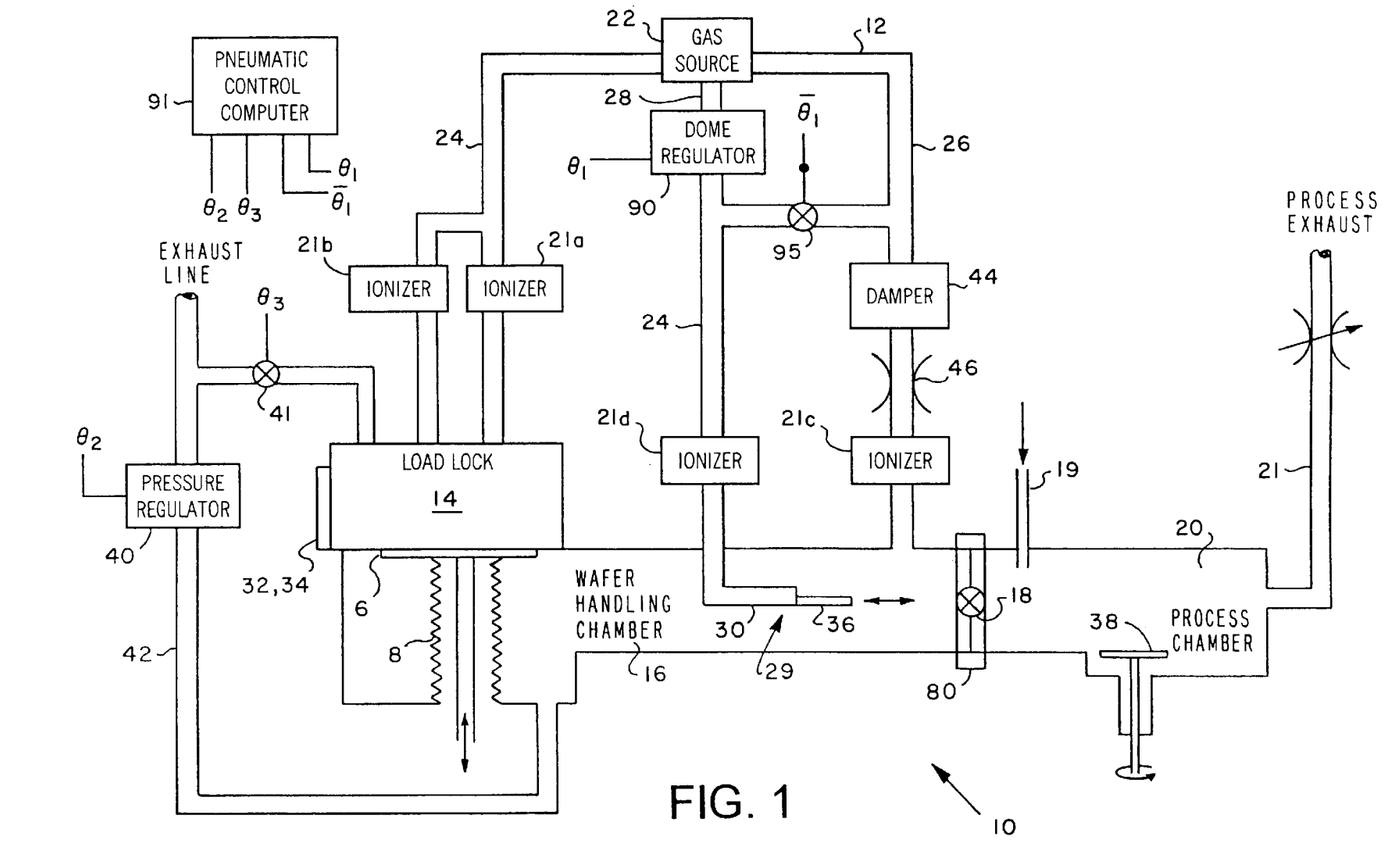
FIG. 1 is a diagram of the semiconductor manufacturing equipment, showing gas purge lines that are associated with the load locks and the wafer handling chamber according to the teachings of the present invention.
Figure 2:
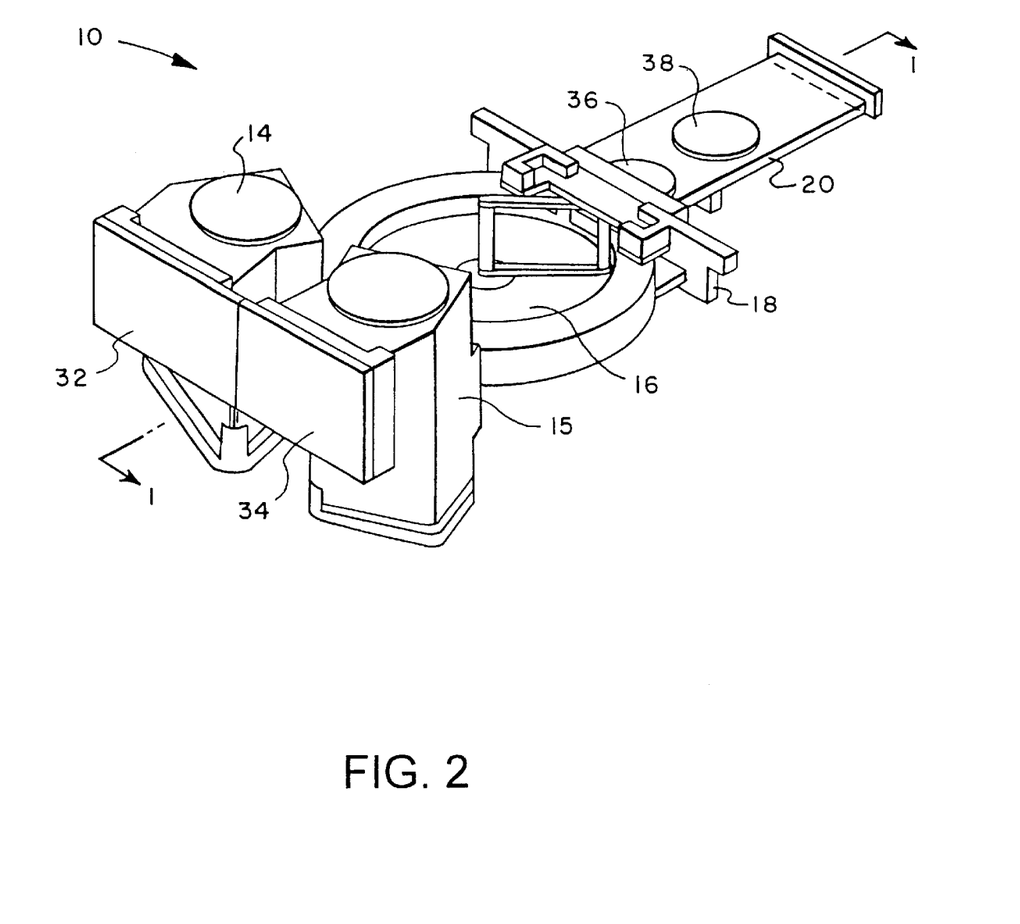
FIG. 2 is a perspective view of the semiconductor manufacturing equipment illustrating the load locks, the wafer handling chamber and an epitaxial reactor.

Referring to FIGS. 1 and 2 wherein FIG. 1 includes a diagram of a piece of semiconductor manufacturing equipment (an epitaxial reactor 10), illustrating a gas purge system 12 that is associated with a wafer transport chamber that includes load locks 14 and 15, and a wafer handling chamber 16. The epitaxial reactor 10 is partitioned into the wafer handling chamber 16, load locks 14 and 15, and a process chamber 20 that is isolated from the load locks 14 and 15 and the wafer handling chamber 16 by isolation gate valve 18.

Prior to processing any semiconductor wafers, the load locks 14 and 15 and wafer handling chamber 16 are purged by purge gas from the gas source 22 that includes a control system. This purge gas flows from the source 22 through the pipes 24 and 26 into the load locks 14 and 15 and wafer handling chamber 16.

In operation, cassettes of semiconductor wafers (not shown) are placed in the load locks 14 and 15 through load lock portals 32 and 34. After loading the wafer cassettes in the load locks 14 and 15, the load lock portals 32 and 34 are closed to isolate the wafers from the surrounding atmosphere. The load locks are purged by the purge gas from the gas source 22. The purge gas such as dry nitrogen flows through the pipes 24 into the load locks 14 and 15. The purge gas purges out oxygen, moisture and undesirable particles that enters the load locks 14 and 15 when the load lock portals 32 and 34 are opened to receive the wafer cassettes.

After completing the purge, the load locks 14 and 15 are opened to the wafer handling chamber by the lowering of the cassette by an elevator 8 which breaks the air tight seal typically located at edge 6, and the wafers are transported sequentially from the cassettes to the process chamber 20 by a transfer arm 29 that has a Bernoulli wand 36 end effecter. While the wafers are transported through the wafer handling chamber 16, the wafer handling chamber 16 is purged by a gas from the gas source 22.

The purge gas from the gas source is made slightly conductive by passing it through ionizer 21a which is connected to load lock 14, ionizer 21b which is connected to load lock 15, ionizer 21c which is connected to the wafer handling chamber 16 and ionizer 21d which is connected to the Bernoulli wand 36 by a flexible tube 30 that is connected to the robotic arm 29. In the embodiment shown, the gas is the same as the purge gas. The ionizers 21a, 21b, 21c, and 21d reduces or removes electrostatic forces from inside the epitaxial reactor 10. The slightly conductive purge gas can discharge any particles from the wafers or inner surfaces of the chamber subject to the purge.

The ionizers may be devices such as Model 2201 ss (alpha particle ionizer manufactured by NRD, Inc. of Grand Island, N.Y. or preferably an electronic ionizer, such as the model 4210 manufactured by Ion Systems of Berkeley, Calif.

The purge gas flows, under pressure, through the ionizers 21a, 21b, 22c, and 21d. The flow rate of the nitrogen purge gas is measured at 15 standard liters per minute (slm), as a Low Flow rate and at 50 slm per minute as a High Flow rate. The flow rate is dependent on the volume of chambers and is selected to be as high as possible without creating turbulence.

A flow rate of 15 slm is common because a higher rate of flow causes turbulence and may stir up and drive particles into suspension with the purge gas. A High Flow rate is only used during maintenance mode when there are no wafers in the epitaxial reactor 10, because it stirs up particles and facilitates the cleaning of the equipment. However, when the purge gas is slightly conductive, any static in the equipment is reduced or eliminated so that the particles are not attracted to surfaces by electrostatic force, such as the semiconductor wafers (not shown).

Preferably, the ionizers 21a, 21b, 21c and 21d, to maximize their effectiveness, are located as close to the load locks 14 and 15 and the wafer handling chamber 16 as possible. Additionally, there should be no bends in the piping that connects the ionizers 21a 21b, 21c and 21d to the load locks 14 and 15 and the wafer handling chamber 16.

Subsequent to the purging of the load locks 14 and 15 and wafer handling chamber 16, the isolation valve 18 is opened. The transfer arm 29 is used to move the wafers from the load lock 14 or 15 into the process chamber 20 for wafer processing. The transfer arm 29, including a low ingestion Bernoulli wand 36, is within the wafer handling chamber 16. In operation, the Bernoulli wand 36 picks up the semiconductor wafers one at a time from the cassettes (not shown) in one of the load locks 14 and 15. Each wafer is then transported through an open isolation gate valve 18 to a susceptor 38 within the process chamber 20. The Bernoulli wand 36 is used to reduce particle accumulation within the epitaxial reactor 10 by avoiding contact with the top and bottom surfaces of the wafers. The Bernoulli wand 36 utilizes a novel non-spiking gas system and uses nitrogen gas, through wand gas supply line 28. However, when the Bernoulli wand 36 picks up a wafer and releases it onto the susceptor 38 in the process chamber 20, the resulting impulse of gas released into the wafer handling chamber 16 causes a pressure spike and a resulting turbulence of gas in the wafer handling chamber 16. Any turbulence causes particles that are present within the wafer handling chamber 16 to be disturbed and lifted into suspension in the purging gas. The particles thus can be transported to a wafer surface, however the presence of a damper 44 dampens the pressure spikes generated from the operation of the Bernoulli wand 36 and prevents the generating of a pressure spike and the resulting turbulence.

When using a Bernoulli wand 36, the gas flow is turned off to drop a wafer at its destination, the remaining gas is vented into the wafer handling chamber 16. This sudden burst of gas flow causes a sudden pressure rise. In order to render the gas flow constant, the damper 44 and orifice 46 are utilized to reduce the pressure spike in the wafer handling chamber 16. When a wafer is released, the dome regulator 90 is shut off and, simultaneously, valve 95 is opened to release the remaining gas flow into the damper 44 and flow resisting orifice 46. When the size of the damper 44 and the size of the orifice 46 are properly sized, the gas flow increase is gradually released into the wafer handling chamber 16 to compensate for the sudden burst. The orifice 46 is sized to provide a tuning mechanism for regulating pressure bursts into the wafer handling chamber 16.

The damper 44 and orifice 46 is used in conjunction with the back pressure regulator 40 that is located in the exhaust line 42 that is connected to the wafer handling chamber 16. The back pressure regulator 40 maintains a constant pressure in the wafer handling chamber 16 and the load locks 14 and 15. When the elevator 8 is sealently pressed against the edge 6, the valve 41 is opened so that the gas load locks 14 and 15 can be vented.

Figure 3:
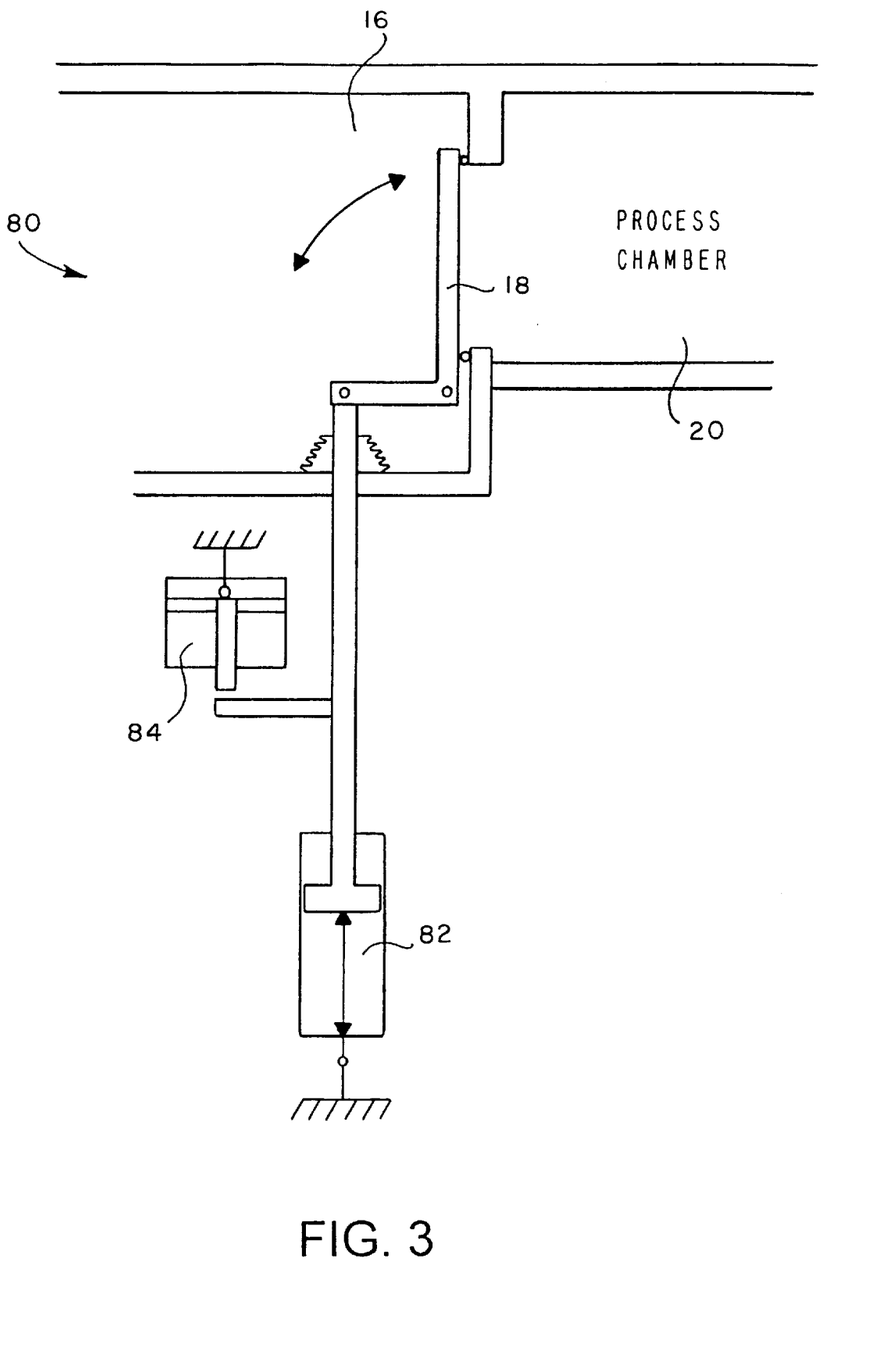
FIG. 3 is a schematic of an isolation valve assembly in the preferred embodiment of the present invention.

Another area in which the gas flow is disturbed occurs when the isolation gate valve 18 is suddenly opened or closed when transporting wafers between the wafer handling chamber 16 and the process chamber 20. In order to minimize this gas flow disturbance, the isolation gate valve includes a valve assembly 80 that is constructed to allow the isolation gate valve 18 to open only a minute amount to allow the pressure to equalize between the wafer handling chamber 16 and the process chamber 20. FIG. 3 is a schematic of the isolation gate valve assembly 80. Once the pressure is equalized between the wafer handling chamber 16 and the process chamber 20, the isolation gate valve 18 continues to open at a fast rate. This results in a minimum disturbance in pressure and gas flow while still allowing fast actuation of the isolation gate valve 18.

The isolation gate valve assembly 80 includes an actuator 82 which is mechanically connected with the isolation gate valve 18, enabling the isolation gate valve 18 to open. Additionally, the isolation gate valve 18 is mechanically connected with a second actuator 84, that actuates the initial opening of the isolation gate valve 18 in a controlled way, allowing the equalization of pressure between the wafer handling chamber 16 and the process chamber 20. The actuator 84 also may control the final closing of the isolation gate valve in a controlled manner. This isolation gate valve assembly 80 provides a multi-speed isolation gate valve, which can reduce or eliminate gas flow bursts which occur in the initial stage of prior art isolation gate valves.

After each wafer is processed, the isolation gate valve 18 is opened and the Bernoulli wand 36 retrieves the processed wafer and loads the wafer into a cassette within one of the load locks (14 or 15). After all of the wafers have been processed, the cassette located within the load lock is removed through one of the portals (32 or 34).

Figure 4:
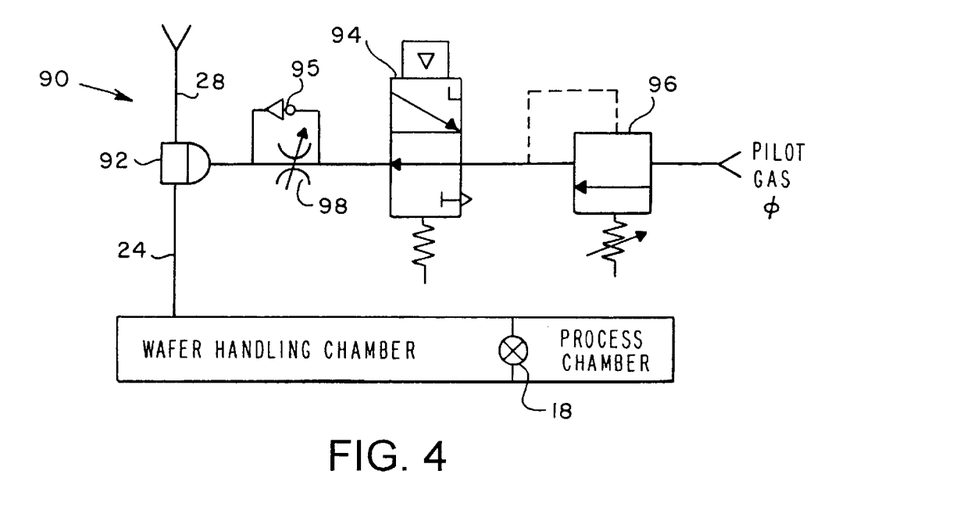
FIG. 4 is a schematic diagram illustrating the dome loaded regulator circuit in a preferred embodiment of the present invention.

Disturbance of the flow and pressure of the purge gas may also occur during the sudden opening or closing of gas valves which feeds gas into the semiconductor manufacturing equipment. A dome loaded regulator circuit 90 is utilized to feed gas into the semiconductor manufacturing equipment. FIG. 4 is a schematic diagram illustrating the dome loaded regulator circuit 90 and includes a dome loaded regulator 92, a valve 94, a pressure regulator 96 and a needle valve 98. The gas flow into the equipment is increased incrementally by the dome loaded regulator 92 which is pneumatically actuated by the valve 94, which controls a restricted gas flow. The gas flow originates from the pressure regulator 96. In addition, the needle valve 98 controls the amount of restriction of the gas flow. However, the needle valve 98 may be a plurality of needle valves and check valves, to regulate different ramp-up and ramp-down flow rates of the purge gas.

Figure 5:
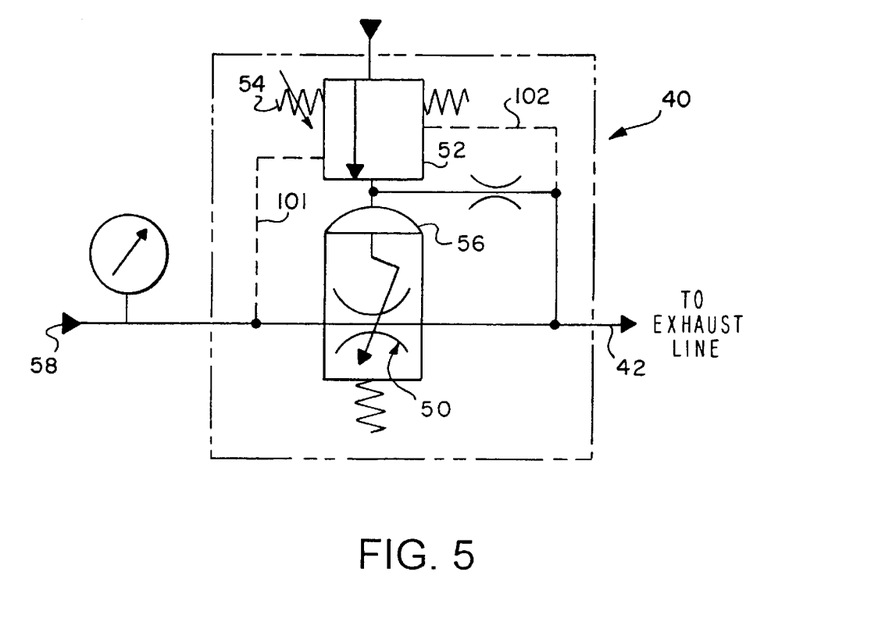
FIG. 5 is a schematic diagram of the pilot operated back pressure regulator in the preferred embodiment of the present invention; and, FIG. 6 is a cross sectional side view of the pilot operated back pressure regulator in the preferred embodiment of the present invention.

FIG. 5 is a schematic diagram of the pilot operated back pressure regulator 40 in the preferred embodiment of the present invention. The pilot operated back pressure regulator 40 includes a pneumatically actuated throttle valve 50 which is actuated by a pressure relay system 52. The pressure relay system 52 is normally a 22:1 ratio pressure relay that adjusts the opening of the pneumatically actuated throttle valve 50 from the sensed pressure across the throttle valve 50 and conduits 101 and 102. The pilot operated back pressure regulator 40 also includes a variable load spring 54 and a throttle valve actuator 56. Additionally, the pilot operated back pressure regulator 40 includes a throttle valve input 58.

Figure 6:
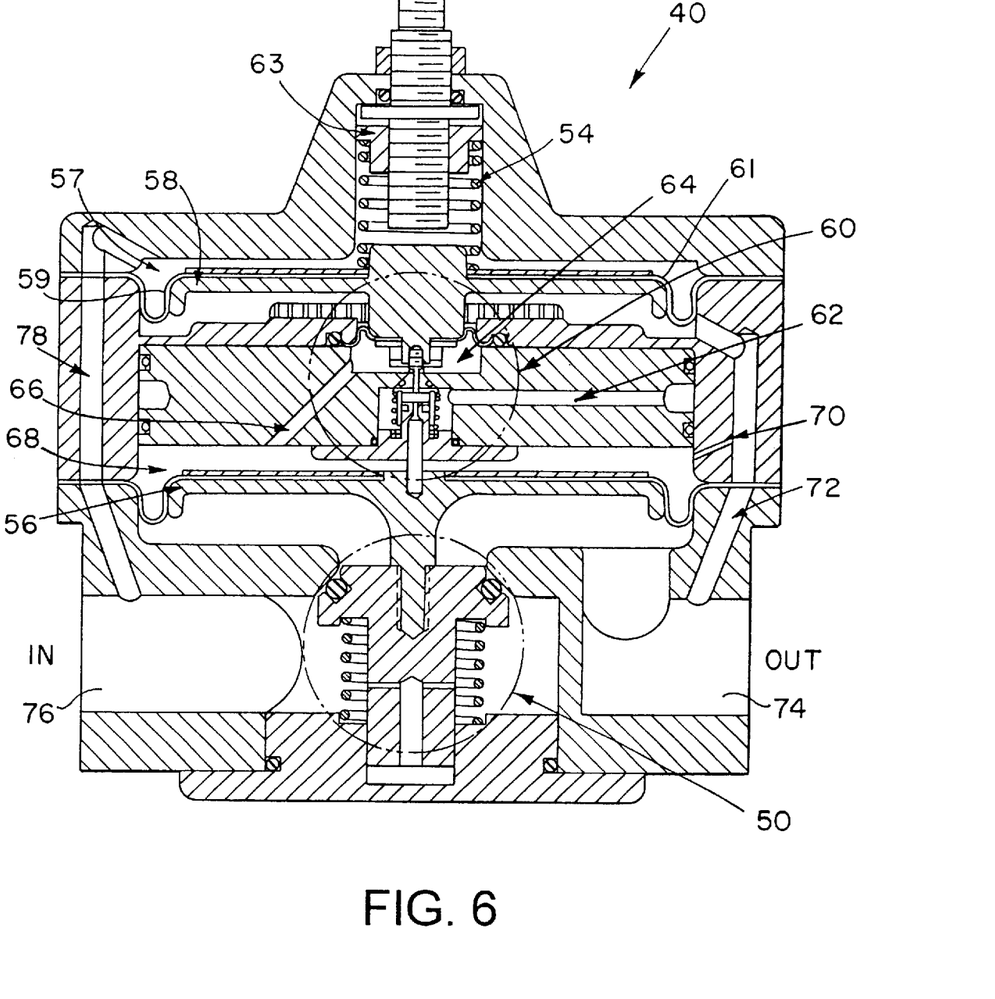

FIG. 6 is a cross sectional side view of the pilot operated back pressure regulator 40 in the preferred embodiment of the present invention. Referring to FIG. 6, the operation of the pilot operated back pressure regulator 40 will now be explained. In order to regulate the pressure within the wafer handling chamber 16, the pilot operated back pressure regulator 40 uses the pneumatically actuated throttle valve 50 to regulated the pressure. The pilot operated back pressure regulator 40 includes the pressure relay system 52, which is a 22:1 pressure relay in the preferred embodiment, and the pneumatically actuated throttle valve 50. The pressure relay system 52 includes a large piston 59 which drives a small pressure reducing regulator 60. A high pressure pilot supply (80 PSI in the preferred embodiment), is feed in through a passage 62. The variable load spring 54 opens the small pressure regulator 60. The opening of the small pressure regulator 60 allows a dynamic flow from a chamber 64 to enter a chamber 68 via a passage 66. The dynamic flow then flows through a bleed passage 70 to a passage 72. From the passage 72, the dynamic flow is exhausted through an output 74 of the pilot operated back pressure regulator 40. This dynamic flow creates a bias pressure on the throttle valve actuator 56 at a level just below the pressure required to drive the throttle valve 50 open. The size of the bleed passage 70, chamber 68, and a chamber 57 determines the response time and pressure differential necessary to drive the throttle valve 50 open. The smaller the bleed passage 70 and chamber 57, the faster the response of the pilot operated back pressure regulator 40. A small increase in pressure at an input 76 for the pilot operated back pressure regulator 40 is transmitted, via a channel 78, to the top of the large piston 58 through the passage 66 driving the small regulator 60 to a higher pressure that is multiplied by the ratio of the pressure relay. This increases the pressure at the top of throttle valve actuator 56 and drives the throttle valve 50 open, relieving the pressure at the input 76 of the pilot operated back pressure regulator 40 and thereby regulating the pressure at the throttle valve input 59.

What is claimed is:

1. A method of processing semiconductor wafers in a semiconductor reactor having a wafer transport chamber having a gas outlet and a reactor chamber, the method comprising the steps of:

reducing particles in a wafer handling chamber including the steps of;

delivering a gas to the wafer handling chamber, and regulating the gas pressure in the wafer transport chamber with a pilot operated back pressure regulator operatively connected to the gas outlet.

2. The method according to claim 1, wherein the gas delivery system includes at least a gas source and a first line connecting the gas source to the wafer transport chamber, the method further comprising the steps of:

regulating the delivery of the gas to the wafer transport chamber in the first line with a dome loaded regulator.

3. The method according to claim 1, wherein the gas delivery system further includes a second line connecting the gas source to the wafer transport system, the method further comprising the steps of:

in the second line, dampering the delivery of the gas to the wafer transport chamber and restricting the flow of gas to the wafer transport chamber.

4. The method according to claim 3, wherein the semiconductor reactor further includes an isolation valve located between the reactor chamber and the wafer transport chamber and the method of reducing particles further includes the steps of:

initially opening the isolation valve at a first speed followed by a second speed.

5. The method according to claim 1, wherein the semiconductor reactor further includes an isolation valve located between the reactor chamber and the wafer transport chamber and the method of reducing particles further includes the steps of:

initially opening the isolation valve at a first speed followed by a second speed.

6. A method of processing semiconductor wafers in a semiconductor reactor having a wafer transport chamber and a reactor chamber, the method comprising the steps of:

reducing particles in a wafer handling chamber including the steps of;

delivering a gas to the wafer handling chamber, and regulating the delivery of the gas to the wafer transport chamber with a dome loaded regulator.

7. The method according to claim 6, wherein the gas delivery system includes at least a gas source and a first line connecting the gas source to the wafer transport system chamber, the method further comprising the steps of, in the first line:

dampering the delivery of the gas to the wafer transport chamber and restricting the flow of gas to the wafer transport chamber.

8. The method according to claim 6, wherein the semiconductor reactor further includes an isolation valve located between the reactor chamber and the wafer transport chamber and the method of reducing particles further includes the steps of:

initially opening the isolation valve at a first speed followed by a second speed.

9. A method of processing semiconductor wafers in a semiconductor reactor having a wafer transport chamber having a gas outlet and a reactor chamber, the method comprising the steps of:

reducing particles in a wafer handling chamber including the steps of; delivering a gas to the wafer handling chamber, and in line dampering the delivery of the gas to the wafer transport chamber means and restricting the flow of gas to the wafer transport chamber.

10. The method according to claim 9, wherein the semiconductor reactor further includes an isolation valve located between the reactor chamber and the wafer transport chamber and the method of reducing particles further includes the steps of:

initially opening the isolation valve at a first speed followed by a second speed.

* * * * *